(12) United States Patent
Li et al.

(10) Patent No.: US 6,868,129 B2
(45) Date of Patent: Mar. 15, 2005

(54) DEMODULATOR FOR A RADIO RECEIVER AND METHOD OF OPERATION

(75) Inventors: Junsong Li, Austin, TX (US); Azfar Inayatullah, Austin, TX (US); Yui-Luen Ho, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 756 days.

(21) Appl. No.: 09/803,750

(22) Filed: Mar. 12, 2001

(65) Prior Publication Data

US 2002/0126771 A1 Sep. 12, 2002

(51) Int. Cl.[7] .................................................. H03D 3/22
(52) U.S. Cl. ........................ 375/324; 375/267; 375/375; 375/346; 329/304; 329/306; 455/186.1; 455/161.1; 455/260
(58) Field of Search ................................ 375/267, 375, 375/346; 329/304, 306; 455/186.1, 161.1, 260

(56) References Cited

U.S. PATENT DOCUMENTS

| | | | | |
|---|---|---|---|---|
| 5,150,384 A | * | 9/1992 | Cahill | 375/375 |
| 5,399,987 A | * | 3/1995 | Yamamoto et al. | 329/306 |
| 5,436,591 A | * | 7/1995 | Henze | 329/304 |
| 5,507,024 A | * | 4/1996 | Richards, Jr. | 455/260 |
| 5,521,944 A | | 5/1996 | Hegeler et al. | 375/329 |
| 5,689,270 A | * | 11/1997 | Kelley et al. | 342/357.09 |
| 6,351,631 B1 | * | 2/2002 | Noeske et al. | 455/260 |
| 6,389,270 B1 | * | 5/2002 | Nohrden et al. | 455/161.1 |
| 6,470,178 B1 | * | 10/2002 | Cummings-Hill et al. | 455/186.1 |
| 6,539,063 B1 | * | 3/2003 | Peyla et al. | 375/267 |
| 6,539,068 B2 | * | 3/2003 | Hebron et al. | 375/346 |
| 6,539,212 B1 | * | 3/2003 | Kamalski | 455/186.1 |
| 6,694,026 B1 | * | 2/2004 | Green | 381/3 |

* cited by examiner

Primary Examiner—Stephen Chin
Assistant Examiner—Sudhanshu C. Pathak
(74) Attorney, Agent, or Firm—Robert L. King; Daniel D. Hill

(57) ABSTRACT

A demodulator (20) extracts a digital sub-carrier signal from a modulated signal and provides the sub-carrier signal in clock and data format. Demodulation occurs with two mixing stages (32, 40, 42) and at sampling frequencies that are independent from the frequency of transmission of the modulated signal. Matched filters (44, 46) try to match the received sub-carrier signal with a predefined bi-phase pulse shape. Phase correction is applied at a low sampling frequency. After phase correction, digital interpolation is used to re-sample the sub-carrier signal.

13 Claims, 4 Drawing Sheets

DEMODULATOR FOR A RADIO RECEIVER AND METHOD OF OPERATION

FIELD OF THE INVENTION

The present invention relates to communication receivers, and more particularly, to demodulators in radio receivers.

BACKGROUND OF THE INVENTION

Some radio transmitters radiate a radio data signal (RDS) that may contain a variety of informational content such as traffic information. Another form of informational signal that may be integrated in a radio transmission is known as Autofahrer Rundfunk Information (ARI). Also, in some locations a radio transmission may include both an RDS component and an ARI component. Both the RDS and the RI signals are radiated with a carrier signal specified by the Cenelec EN50067:1998 standard to be 57 kHz. For RDS signals, the carrier is suppressed. A receiver, thus, may receive a multiplex signal from one transmitter or, depending on its physical location, a mix of RDS and ARI signals, or only RDS, or only ARI signals. The receiver, thus, must be capable of recognizing the three possibilities, and distinguish between the three signals, whether they occur separately or simultaneously.

BRIEF DESCRIPTION OF THE DRAWINGS

Illustrated in FIG. 1 in block diagram form is a block diagram of an FM radio receiver;

Illustrated in FIG. 2 in block diagram form is a demodulator in accordance with the present invention for use in the receiver of FIG. 1;

Figure 2:
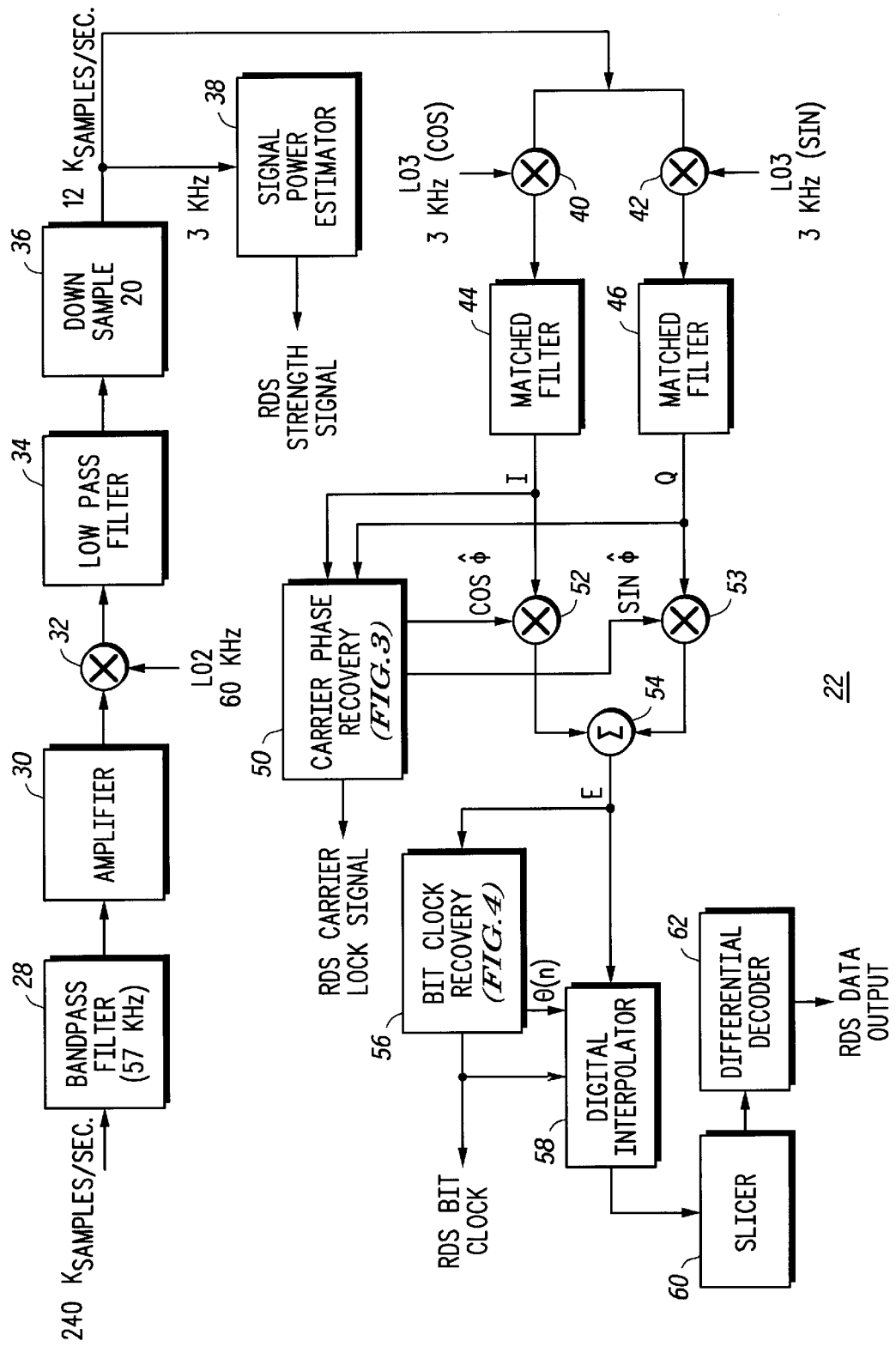
Figure 3:
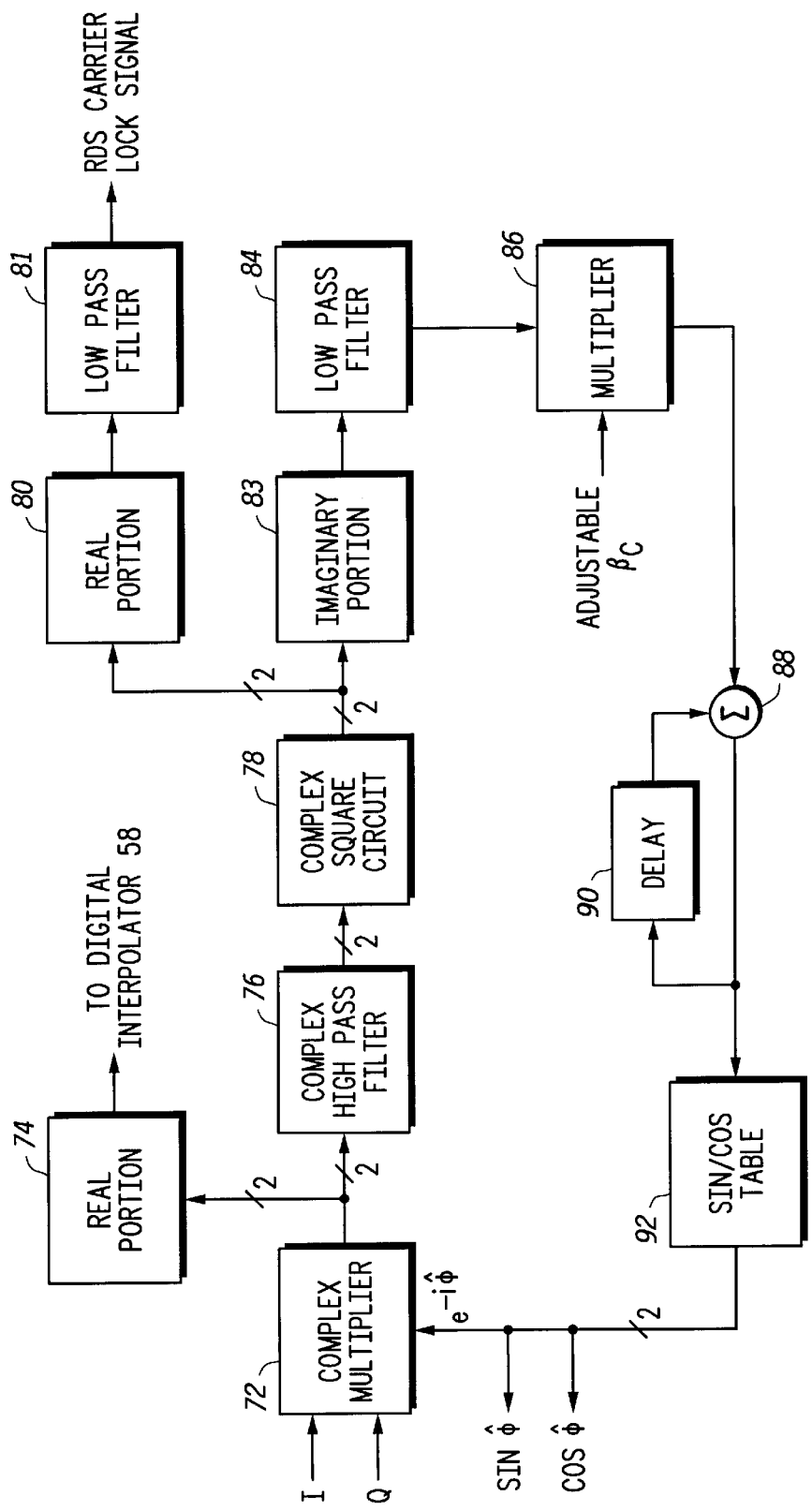
Figure 4:
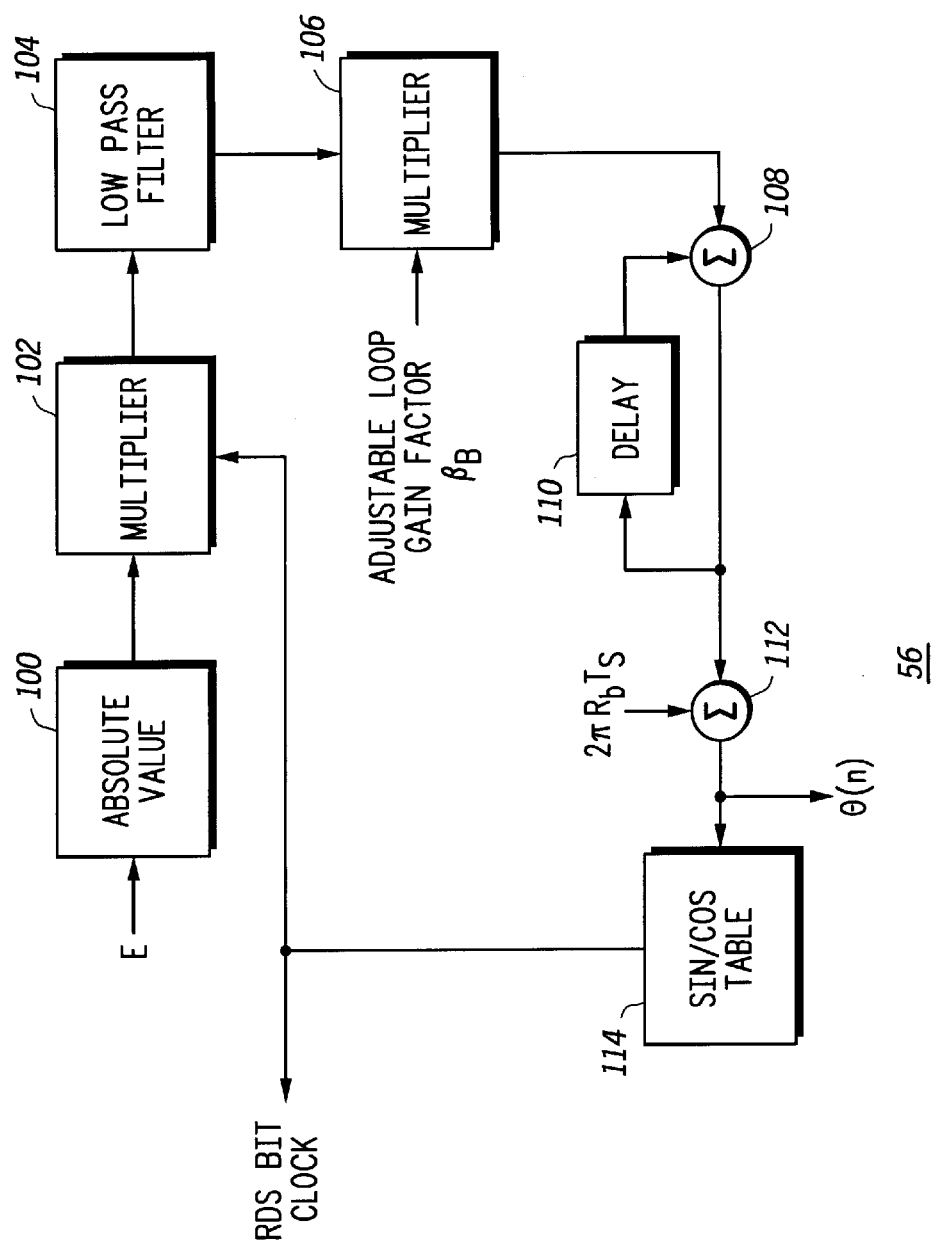

Illustrated in FIG. 3 in block diagram form is a carrier phase recovery portion of the demodulator of FIG. 2;

Illustrated in FIG. 4 in block diagram form is a bit clock recovery portion of the demodulator of FIG. 2.

DETAILED DESCRIPTION OF THE DRAWINGS

Figure 1:
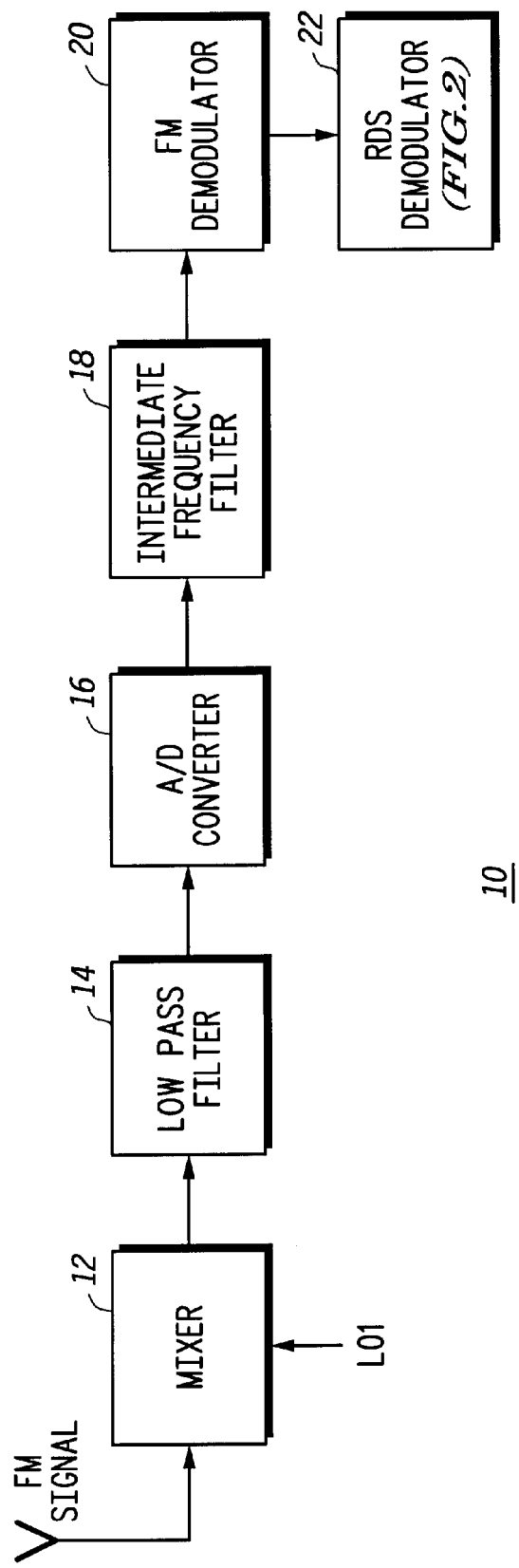

Illustrated in FIG. 1 is an FM receiver 10 that is one of many possible uses for a demodulator such as the demodulator taught herein. In the illustrated form, an FM signal is received by an antenna and coupled to an input of a mixer 12. An output of mixer 12 is connected to a low pass filter 14. An output of low pass filter 14 is connected to an input of an A/D converter 16. An output of A/D converter 16 is connected to an input of an intermediate frequency filter 18. An output of the intermediate frequency filter 18 is connected to an input of an FM demodulator 20. An output of the FM demodulator 20 is connected to an input of an RDS demodulator 22 which will be explained in detail below.

In operation, mixer 12 takes a received input signal from the antenna and multiplies the input signal with a first local oscillator (LO) frequency, LO1. The resulting product is an intermediate frequency containing both a sum and a difference component. Low pass filter 14 removes the sum component and couples the difference component to A/D converter 16. The A/D converter 16 performs a conversion of the filtered signal to a digital format. The intermediate frequency filter 18 functions to digitally filter the signal to improve the signal-to-noise ratio. At the output of intermediate frequency filter 18 a substantially clean digital signal is presented to the FM demodulator 20. Since the received radio signal was frequency modulated in order to be transmitted, the FM demodulator 20 removes the frequency modulation from the received signal to reduce the signal to its informational content, often referred to as a multiplexed signal MPX. Up to this point in the discussion, the described operation is conventional with respect to FM reception. When RDS and/or ARI information is transmitted within an FM signal, the MPX signal provided by the FM demodulator 20 will contain the RDS and/or ARI signal. The RDS demodulator 22 functions to remove the RDS content from the demodulated output of FM demodulator 20 in an efficient and fast method as described below.

Illustrated in FIG. 2 is a detail of a demodulation circuit in the form of RDS demodulator 22 of FIG. 1. In one form, a bandpass filter 28 has an input terminal for receiving the output of FM demodulator 20. An output terminal of bandpass filter 28 is connected to an input terminal of an amplifier 30. An output terminal of amplifier 30 is connected to a first input terminal of a mixer 32. A second input terminal of mixer 32 is connected to a local oscillator frequency (LO2). An output terminal of mixer 32 is connected to an input terminal of a low pass filter 34. An output terminal of low pass filter 34 is connected to an input terminal of a down sample converter 36. An output terminal of down sample converter 36 is connected to an input terminal of a signal power estimator 38, to a first input terminal of a mixer 40, and to a first input terminal of a mixer 42. An output terminal of signal power estimator 38 provides an RDS strength signal at an output thereof. A second input terminal of mixer 40 is connected to a cosine component of a third local oscillator frequency (LO3). A second input terminal of mixer 42 is connected to a sine component of the third local oscillator frequency (LO3). An output terminal of mixer 40 is connected to an input terminal of a matched filter 44. An output terminal of mixer 42 is connected to an input terminal of a matched filter 46. An output terminal of matched filter 44 provides a real component signal, I, that is connected to both a first input terminal of a carrier phase recovery circuit 50 and a first input terminal of a phase correction circuit 52. An output terminal of matched filter 46 provides an imaginary component signal, Q, which is connected to both a second input terminal of carrier phase recovery circuit 50 and a first input terminal of a phase correction circuit 53. A first output terminal of carrier phase recovery circuit 50 is connected to a second input terminal of phase correction circuit 52, and a second output terminal of carrier phase recovery circuit 50 is connected to a second input terminal of phase correction circuit 53. An output terminal of carrier phase recovery circuit 50 provides an RDS lock signal indicating the presence of RDS carrier lock. An output terminal of phase correction circuit 52 is connected to a first input of an adder 54. An output terminal of phase correction circuit 53 is connected to a second input terminal of adder 54. An output terminal of adder 54, E, is connected to an input terminal of a bit clock recovery circuit 56 and to a first input terminal of a digital interpolator 58. A first output terminal of bit clock recovery circuit 56 provides a recovered RDS bit clock signal that is also connected to a second input terminal of digital interpolator 58. A second output terminal of bit clock recovery circuit 56 provides a signal labeled "θ(n)" which will be described below in connection with FIG. 4. An output terminal of digital interpolator 58 is connected to an input terminal of a slicer circuit 60 for providing a resampled phase corrected signal. Slicer circuit 60 has an output for providing a bit signal that is connected to an input terminal of a differential decoder 62. An output terminal of differential decoder 62 provides an RDS data output signal at an RDS data output terminal.

For purposes of illustration only, the MPX signal is assumed to be sampled at 240 thousand samples per second.

Generally, the MPX signal is a data signal that is sampled at a first sample rate. If an RDS signal and/or ARI signal is present within the FM demodulated signal, MPX, the RDS and/or ARI signal will be present at the frequency of 57 kHz. Therefore, bandpass filter 28 is centered at a first frequency of 57 kHz to recover any frequency component centered around 57 kHz. Bandpass filter 28 provides a bandpass filtered data signal at the first frequency. Because the signal content of RDS and/or ARI signals is relatively small as compared to the received MPX signal, an amplification of the bandpass filtered RDS and/or ARI signal is desired. In a preferred form, amplifier 30 is implemented as a user programmable amplifier having a variable gain factor. Various signal conditions will affect and determine the amount of amplification desired and/or needed. The amplified RDS and/or ARI signal is mixed with a local oscillator signal. In one form, the first local oscillator signal is chosen as 60 KHz. Mixer 32 has an output terminal for providing a frequency shifted signal, wherein the first sample rate is a multiple of the frequency of the first local oscillator signal. It should be readily understood that the frequency that is used with mixer 32 is arbitrary and may be one of many different frequencies. However, by using a first local oscillator signal having a relatively low frequency such as 60 KHz and one which is an integer multiple of the sampling rate frequency, certain advantages follow. In particular, having an integer multiple of four between the input MPX sampling rate and the second local oscillator frequency (LO2) results in a simplified sine/cosine table structure when performing multiplication and other DSP functions. By repeating the sequence of the terms (1, 0, −1, 0), a 60 KHz frequency may be generated for the second input of mixer 32 when each of these four digital values are present at the rate of 240 K samples per second which is the sampling frequency of MPX and therefore the same clock may be used in the generation of both inputs to mixer 32. It should be noted that the frequency of the signal being mixed with the 60 KHz signal is 57 KHz and that it is also desired that these two frequencies be relatively close. The mixed signal output (sum and difference) of mixer 32 is low pass filtered by low pass filter 34 to produce the difference signal only at the output terminal of low pass filter 34. The difference signal is then down sampled or decimated by a factor of twenty by down sample converter 36. Down sample converter 36 provides a down-sampled signal having a second sample rate. The resulting output signal has a sampling frequency of 12 thousand samples per second. It should be further noted that the information content of the signal at the output of down sample circuit 36 is only 3 KHz due to the difference signal provided by low pass filter 34 being 60 KHz minus 57 KHz. Signal power estimator 38 functions to detect when the RDS and/or ARI signal has informational content present and provides an RDS strength signal in response to such detection. In other words, signal power estimator 38 provides a signal strength of the down-sampled signal. The down sampled RDS and/or ARI signal is connected to both mixer 40 and mixer 42. Mixer 40 provides a sum and difference signal of the received 3 KHz signal with a cosine component of a 3 KHz signal. Similarly mixer 42 provides a sum and difference signal of the received 3 KHz signal with a sine component of a 3 KHz signal. By repeating the sequence of the terms (1, 0, −1, 0), a 3 KHz frequency may be generated for the second input of mixer 40 when each of these four digital values are present at the rate of 12 K samples per second which is the sampling frequency at the output of down sampler 36, and therefore the same clock may be used in the generation of both inputs to mixer 40. By repeating the sequence of the terms (0, 1, 0, −1), a 3 KHz frequency may be generated for the second input of mixer 42 when each of these four digital values are present at the rate of 12 K samples per second which is the sampling frequency at the output of down sampler 36, and therefore the same clock may be used in the generation of both inputs to mixer 42. Mixer 40 and mixer 42 may be collectively viewed as a second mixer to mixer 32 wherein the second mixer is a quadrature mixer. In a general view, the second mixer has a first input terminal for receiving the down-sampled signal, a second input terminal for receiving a second local oscillator signal, and an output for providing a baseband signal. The second sample rate that the down-sampled signal has is a multiple of the difference between the first local oscillator signal frequency and the first frequency.

Matched filters 44 and 46 are identical in function and may be collectively considered as a second bandpass filter. Generally, matched filters 44 and 46 receive the baseband signal and provide a filtered baseband signal. The matched filters 44 and 46 are matched to a waveform of the baseband signal to provide a filtered quadrature signal. Each of these filters functions to detect when their respective inputs match or coincide with a predetermined signal relationship. The inputs provided to matched filters 44 and 46 are different because they are ninety degrees out of phase. Match filter 44 filters the real component of the RDS and/or ARI signal while match filter 46 filters the imaginary component of the RDS and/or ARI signal. Each of matched filters match to a biphase pulse shape which is specified for RDS by the Cenelec 50067:98 standard. Although matched filters 44 and 46 are preferably implemented with identical circuitry, each will have a different output since each receives differing input signals.

Both the real and imaginary components of the RDS and/or ARI signal are connected to carrier phase recovery circuit 50 and to phase correction circuits 52 and 53. For a more complete understanding of the next function performed on the RDS signal, reference should be made to FIG. 3.

Illustrated in FIG. 3 is an exemplary form of carrier phase recovery circuit 50. The real component of the RDS signal, I, and the imaginary component of the RDS signal, Q, are respectively connected to first and second input terminals of a complex multiplier 72. An output terminal of multiplier 72 is connected to an input terminal of a real portion extractor circuit 74 which has an output terminal connected to digital interpolator 58. An output terminal of complex multiplier 72 is connected to an input terminal of a complex high pass filter 76. An output terminal of high pass filter 76 is connected to an input terminal of a complex square circuit 78. A first output terminal of complex square circuit 78 is connected to an input terminal of a real portion extractor circuit 80. An output terminal of real portion extractor circuit 80 is connected to an input terminal of a low pass filter 81. An output terminal of low pass filter 81 provides an RDS Carrier Lock Signal. A second output terminal of imaginary portion extractor 83 is connected to an input terminal of a low pass filter circuit 84. An output terminal of low pass filter 84 is connected to a first input terminal of a multiplier 86. A second input terminal of multiplier 86 is connected to a signal that is an adjustable multiplication factor, $\beta_c$. An output terminal of multiplier 86 is connected to a first input terminal of a summation circuit or a summer 88. An output terminal of summer 88 is connected to an input terminal of a delay circuit 90 and to an input terminal of a sine/cosine table 92. An output terminal of delay circuit 90 is connected to a second input terminal of summer 88. An output terminal of sine/cosine table 92 provides both a Sine 0 and a Cosine 0 signal that are respectively connected to the second input terminals of mixers 53 and 52. Additionally, the output terminal of sine/cosine table 92 provides a complex signal, $e^{-j\Phi}$, representing the phase error to complex multiplier 72.

In operation, components 72, 76, 78, 83, 84, 86, 88, 90 and 92 form a loop which functions collectively as a digital phase locked loop (DPLL). The object of the DPLL is to quickly determine when the received signal as represented by I and Q has attained lock (stability) at a predetermined frequency, in this case 57 kHz. Signals I and Q are multiplied with the phase error $e^{-j\Phi}$, the phase error being a difference in phase between the down-sample signal and the second local oscillator signal. The complex multiplier 72 provides a phase error information signal. The real component is removed by real portion extractor 74 and is provided to the digital interpolator 58. Both the real and imaginary components of the product from complex multiplier 72 form the phase error information signal and are filtered by complex high pass filter 76 to provide a complex filtered output that represents a sum signal of the inputs of multiplier 72. The output of complex high pass filter 76 is a highpass filtered phase error information signal. In most applications an ARI signal will not be present with an RDS signal. However, should an ARI signal exist, complex high pass filter 76 functions to remove the ARI signal that typically has a frequency in the range of 200 Hz. It should be noted that the presence or absence of the ARI signal does not change system performance of the demodulator as taught herein. Complex square circuit 78 performs a complex squaring operation on the resulting filtered output to provide a squared filtered phase error information signal that is a complex product. Real portion extractor 80 couples the real part of the squared filtered phase error information signal to low pass filter 81, and imaginary portion extractor 83 couples the imaginary part of the squared filtered phase error information signal to low pass filter 84. An output of low pass filter 81 provides an RDS carrier lock signal which indicates whether the carrier is phase locked to the 57 KHz RDS signal. An output of low pass filter 84 provides a low pass filtered phase error signal. The output of low pass filter 84 is multiplied via multiplier 86 by the adjustable loop gain factor $\beta_c$ to determine the bandwidth of the loop. The output of multiplier 86 is an amplified phase error signal. Summer 88 and delay circuit 90 collectively function as an integrator to accumulate (i.e. sum) the amplified phase error signal to provide a phase difference in the form of accumulated phase information. The accumulated phase information is used to read a value from the sine/cosine table 92 that determines the compensated phase which is applied as a multiplicand to complex multiplier 72.

Referring back to FIG. 2, the cosine $\hat{\phi}$ and sine $\hat{\phi}$ phase information determined by carrier phase recovery circuit 50 is connected respectively to phase correction circuits 52 and 53. Phase correction circuit 52 functions to multiply the phase correction signal with the real component of the RDS and/or ARI signal. Similarly, phase correction circuit 53 functions to multiply the phase correction signal with the imaginary component of the RDS and/or ARI signal. The outputs of phase correction circuits 52 and 53 are added by summer 54 to provide signal E that is the RDS signal that is a phase corrected signal. At this point, any ARI component that may have existed in the MPX signal has been removed from the signal.

Illustrated in FIG. 4 is an exemplary embodiment of the bit clock recovery circuit 56 that receives signal E. An absolute value circuit 100 receives signal E and has an output terminal connected to an input terminal of a multiplier 102. An output terminal of multiplier 102 is connected to an input terminal of low pass filter 104. An output terminal of low pass filter 104 is connected to a first input terminal of a multiplier 106. An output terminal of multiplier 106 is connected to a first input terminal of a summer 108. A second input terminal of multiplier 106 is connected to an adjustable loop gain factor $\beta_B$. A second input terminal of summer 108 is connected to an output terminal of a delay circuit 110. An output terminal of summer 108 is connected to an input terminal of delay circuit 110 and to an input terminal of a summer 112. A second input terminal of summer 112 is connected to a signal equal to $2\Pi R_b T_s$, which is a free running local clock. An output terminal of summer 112 is a signal labeled "θ(n)" and is connected to an input terminal of a sine/cosine table 114. The signal "θ(n)" is also connected to a third input of digital interpolator 58. An output terminal of sine/cosine table 114 is connected to a second input terminal of multiplier 102 and provides a RDS bit clock signal.

In operation, absolute value circuit 100 functions to make the signal E a continuously positive signal regardless of the sign of the result of the summation by the summer 54. Elements 102, 104, 106, 108, 110, 112 and 114 function as a digital phase locked loop (DPPL). Multiplier 102 receives an absolute value of the phase corrected signal and the recovered RDS bit clock signal. Low pass filter 104 provides a clock phase error. Multiplier 106 provides an amplified clock phase error. Summer 108 and delay circuit 110 function as an integrator for accumulating the amplified phase error to provide a phase difference. Summer 112 adds the phase difference to a free-running local clock and accumulates a result to generate a clock phase. The sine/cosine table 114 provides the recovered RDS bit clock signal as indexed by the clock phase. It should be well understood that absolute value circuit 100 may be implemented as a squaring (multiplication) operation. The demodulator has previously locked or synchronized to the carrier frequency of the data signal. At this point, this loop of elements is functioning to lock to each RDS bit in the RDS signal. It should be noted that the loop is functioning at twelve thousand samples per second, but the RDS bit clock provided at the output of bit clock recovery circuit 56 has a frequency of 1.1875 KHz. The digital interpolator 58 will therefore function to correct this disparity in frequency rates. In particular, digital interpolator 58 decimates the sampling rate from 12 thousand samples per second to approximately 1.1875 thousand samples per second. The signal provided at the output of digital interpolator 58 is synchronized with the RDS bit clock.

The signal at twelve thousand samples per second contains the 1.1875 K samples per second signal and is pseudo-sinusoidal. The digital interpolator tries to resample the point where a zero crossing of the 1.1875 K samples per second signal occurs. If the RDS bit clock in the sample that was two samples earlier, (n−2), is greater than zero and the RDS bit clock in the previous sample, (n−1), is less than zero, we must subtract the phase of the RDS bit clock that was two samples prior to the current RDS phase from the constant pi (Π). This relationship may be expressed by the following equation:

$$U=\Pi-\theta(n-2). \quad \text{Eq. (1)}$$

The previous RDS sample, RDS(n−1), is equal to:

$$RDS(n-1)=(1-U)\cdot E(n-2)+U\cdot E(n-1). \quad \text{Eq. (2)}$$

If the stated conditions do not occur, digital interpolator 58 maintains the same output condition.

The synchronized output signal of digital interpolator 58 is connected to slicer circuit 60 that makes a decision whether the input is positive or negative. If the input is positive, a logic one value is assigned to the signal value. If the input is negative, a logic zero value is assigned to the signal value. These assignments occur for each sample at approximately 1.1875 thousand samples per second. The differential decoder receives the converted digital output of slicer circuit 60 and provides the RDS data by comparing a new data bit with an immediately preceding data bit. Should the data bits vary in logic value, a digital one output is assigned as the RDS data. Should the data bits not vary in logic value, whether the values are a one or a zero value, a digital zero output is assigned as the RDS data.

By now it should be apparent that there has been provided an RDS demodulator in a digital intermediate frequency (DIF) radio receiver. It should be well understood that although a specific embodiment of the present invention has been illustrated with hardware circuits, the present invention and method may be implemented by software. For example, the described functions such as filtering, amplification, down sampling, mixing, decoding, interpolation, decimation, bit slicing and clock recovery may readily be implemented solely in software without generating any hardware components specifically dedicated to these functions. After bandpass filtering to extract an RDS signal, two distinct mixing stages are used to down-convert the passband RDS signal into baseband. The use of two mixing stages has the advantage of reducing the speed of operation associated with lookup operations of sine/cosine lookup tables. By using two mixing stages, the sampling frequency is reduced to a lower rate. Also, the phase correction or compensation that must be implemented occurs at a much lower sample rate of operation.

The present invention is adept at operating using clock signals that are asynchronous and totally unrelated to the frequencies associated with the transmission of the signal being received. As a result, significant design flexibility in selecting frequencies of operation are provided to designers, particularly in selecting hardware components which may have specific frequency constraints. For example, a demodulator system using the present invention may be designed to avoid extremely fast, and therefore expensive, processors required for implementing high sampling rate data operations.

The matched filters 44 and 46 operate to match to the bi-phase pulse shape of RDS, and not to a single component pulse. By matching to the bi-phase pulse shape of RDS, an optimal receiver may be implemented having very low signal-to-noise ratios, such as 3 dB or less.

The present invention is illustrated by way of example and not by limitation in the accompanying figures, in which like references indicate similar elements. In the following description, numerous specific details are set forth such as the specific use of RDS and ARI. It should be well understood that the demodulation method taught herein may be applied to other signal transmissions than FM modulation and may also be applicable to other digital information that has been encoded into a modulated signal. It will be obvious to those skilled in the art that the present invention may be practiced without specific details such as frequency of operation and sampling, type of modulated data, and type of frequency table used. In other instances, circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

It should be realized that alternate embodiments of the present invention could include the implementation of the demodulator with a combination of software and hardware, known as firmware.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A demodulator for a radio receiver, comprising:

a first bandpass filter having an input terminal for receiving a data signal at a first sample rate, the data signal having multiple informational signals, the first bandpass filter centered at a first frequency, and an output terminal for providing a bandpass filtered data signal at the first frequency;

a first mixer having a first input terminal for receiving the bandpass filtered data signal, a second input terminal for receiving a first local oscillator signal, and an output terminal for providing a frequency shifted signal, wherein the first sample rate is a multiple of a first local oscillator signal frequency;

a down sampler having an input terminal for receiving the frequency shifted signal, and an output terminal for providing a down-sampled signal having a second sample rate;

a second mixer having a first input terminal for receiving the down-sampled signal, a second input terminal for receiving a second local oscillator signal, and an output terminal for providing a baseband signal in a first form and in a second form, the second form being ninety degrees out of phase from the first form, wherein the second sample rate is a multiple of a difference between the first local oscillator signal frequency and the first frequency;

a first matched filter having an input for receiving the baseband signal in the first form and detecting when the baseband signal in the first form matches a predetermined biphase pulse shape of the baseband signal, the first matched filter providing a real component of a filtered baseband signal;

a second matched filter having an input for receiving the baseband signal in the second form and detecting when the baseband signal in the first form matches the predetermined biphase pulse shape of the baseband signal, the first matched filter and the second matched filter forming a second bandpass filter, the second matched filter providing an imaginary component of the filtered baseband signal, the filtered baseband signal having at least one of the multiple informational signals removed and comprising radio data signal RDS) content;

a carrier phase recovery circuit coupled to the first matched filter and the second matched filter for receiving the real component and the imaginary component of the filtered baseband signal, and in response, for providing a RDS lock signal at a first output, and for providing a phase correction signal at a second output;

first and second phase correction circuits respectively coupled to the first matched filter and the second matched filter, the first matched filter and the second matched filter respectively receiving cosine and sine forms of the phase correction signal;

a summer coupled to the first and second phase correction circuits for summing outputs of the first and second phase correction circuits and providing a phase corrected signal;

a bit clock recovery circuit having an input terminal for receiving the phase corrected signal, and an output for providing a recovered RDS bit clock signal;

an interpolator having a first input terminal for receiving the phase corrected signal, a second input terminal for receiving the recovered RDS bit clock signal, and an output for providing a resampled phase corrected signal;

a slicer for receiving the resampled phase corrected signal, and in response, providing a bit signal; and a differential decoder for receiving the bit signal, differentially decoding the bit signal to provide an RDS data output.

2. The demodulator of claim 1, wherein the bit clock recovery circuit further comprises:

a multiplier having a first input for receiving an absolute value of the phase corrected signal, a second input for receiving the recovered RDS bit clock signal, and an output;

a low pass filter having an input coupled to the output of the multiplier, and an output for providing a clock phase error;

a multiplier having a first input coupled to the output of the low pass filter, a second input for receiving an adjustable gain factor, and an output for providing an amplified clock phase error;

an integrator coupled to the output of the multiplier for accumulating the amplified clock phase error to provide a phase difference;

a summation circuit for adding the phase difference to a free-running local clock and accumulating a result to generate a clock phase; and a sine/cosine look-up table for providing the recovered RDS bit clock signal as indexed by the clock phase.

3. A demodulator for a radio receiver comprising:

a first bandpass filter having an input terminal for receiving a data signal at a first sample rate, the first bandpass filter centered at a first frequency, and an output terminal for providing a bandpass filtered data signal at the first frequency;

a first mixer having a first input terminal for receiving the bandpass filtered data signal, a second input terminal for receiving a first local oscillator signal, and an output terminal for providing a frequency shifted signal, wherein the first sample rare is a multiple of a first local oscillator signal frequency;

a down sampler having an input terminal for receiving the frequency shifted signal, and an output terminal for providing a down-sampled signal having a second sample rate;

a second mixer having a first input terminal for receiving the down-sampled signal, a second input terminal for receiving a second local oscillator signal, and an output terminal for providing a baseband signal, wherein the second sample rate is a multiple of a difference between the first local oscillator signal frequency and the first frequency;

a second bandpass filter for receiving the baseband signal, and for providing a filtered baseband signal, the second bandpass filter comprising a matched filter that is matched to a radio data system (RDS) bi-phase pulse waveform of the baseband signal, the matched filter having an output for providing a filtered quadrature signal;

a carrier phase recovery circuit coupled to the matched filter for receiving the filtered quadrature signal, and in response, for providing a RDS lock signal at a first output, and for providing a phase correction signal at a second output;

a phase correction circuit having a first input coupled to the output of the matched filter, a second input for receiving the phase correction signal, and an output for providing a phase corrected signal;

a bit clock recovery circuit having an input terminal for receiving the phase corrected signal, and an output for providing a recovered RDS bit clock signal;

an interpolator having a first input terminal for receiving the phase corrected signal, a second input terminal for receiving the recovered RDS bit clock signal, and an output for providing a resampled phase corrected signal;

a slicer for receiving the resampled phase corrected signal, and in response, providing a bit signal; and a differential decoder for receiving the bit signal, differentially decoding the bit signal to provide an RDS data output.

4. The demodulator of claim 3, wherein the bit clock recovery circuit further comprises:

a multiplier having a first input for receiving an absolute value of the phase corrected signal, a second input for receiving the recovered RDS bit clock signal, and an output;

a low pass filter having an input coupled to the output of the multiplier, and an output for providing a clock phase error;

a multiplier having a first input coupled to the output of the low pass filter, a second input for receiving an adjustable gain factor, and an output for providing an amplified clock phase error;

an integrator coupled to the output of the multiplier for accumulating the amplified clock phase error to provide a phase difference;

a summation circuit for adding the phase difference to a free-running local clock and accumulating a result to generate a clock phase; and a sine/cosine look-up table for providing the recovered RDS bit clock signal as indexed by the clock phase.

5. The demodulator of claim 3, wherein the carrier phase recovery circuit further comprises:
- a complex multiplier for multiplying the filtered quadrature signal with a phase error, the phase error being a difference in phase between the down-sampled signal and the second local oscillator signal, the complex multiplier providing a phase error information signal;
- a complex highpass filter for receiving the phase error information signal, and in response, providing a highpass filtered phase error information signal;
- a complex square circuit for receiving the highpass filtered phase error information signal, and in response, providing a squared filtered phase error information signal;
- a first lowpass filter for receiving a real part of the squared filtered phase error information signal, and an output for providing a RDS lock signal;
- a second lowpass filter for receiving an imaginary part of the squared filtered phase error information signal, and an output for providing a lowpass filtered phase error signal;
- a multiplier for multiplying the lowpass filtered phase error signal by a gain factor to generate an amplified phase error signal;
- an integrator for accumulating the amplified phase error signal to provide a phase difference; and
- a sine/cosine table for receiving the phase difference to generate the phase error.

6. The demodulator of claim 3, further comprising a signal power estimator having an input for receiving the down-sampled signal, and for providing a signal strength of the down-sampled signal.

7. A demodulation circuit, comprising:
- a bandpass filter having an input terminal for receiving a data signal at a first sample race, the bandpass filter centered at a first frequency, and an output terminal for providing a bandpass filtered data signal at the first frequency;
- a first mixer having a first input terminal for receiving the bandpass filtered data signal, a second input terminal for receiving a first local oscillator signal, and an output terminal for providing a frequency shifted signal, wherein the first sample rate is a multiple of a frequency of the first local oscillator signal;
- a down sampler having an input terminal for receiving the frequency shifted signal, and an output terminal for providing a down-sampled signal having a second sample rate;
- a quadrature mixer having a first input terminal for receiving the down-sampled signal, a second input terminal for receiving a second local oscillator signal, and an output terminal for providing a baseband signal, wherein the second sample rate is a multiple of at difference between the frequency of the first local oscillator signal and the first frequency; and
- a matched filter for receiving the baseband signal, and for providing a filtered quadrature signal at an output, the matched filter being matched to a radio data system (RDS) bi-phase pulse waveform;
- a carrier phase recovery circuit coupled to the matched filter for receiving the filtered quadrature signal, and in response, for providing a lock signal at a first output, and for providing a phase correction signal at a second output;
- a phase correction circuit having a first input coupled to the output of the matched filter, a second input for receiving the phase correction signal, and an output for providing a phase corrected signal;
- a bit clock recovery circuit having an input terminal for receiving the phase corrected signal, and an output for providing a recovered RDS bit clock signal;
- an interpolator having a first input terminal for receiving the phase corrected signal, a second input terminal for receiving the recovered RDS bit clock signal, and an output for providing a resampled phase corrected signal;
- a slicer for receiving the resampled phase corrected signal, and in response, providing a bit signal; and
- a differential decoder for receiving the bit signal, differentially decoding the bit signal to provide an RDS data output.

8. The demodulation circuit of claim 7, wherein the bit clock recovery circuit further comprises:
- a multiplier having a first input for receiving an absolute value of the phase corrected signal, a second input for receiving the recovered RDS bit clock signal, and an output;
- a low pass filter having an input coupled to the output of the multiplier, and an output for providing a clock phase error;
- a multiplier having a first input coupled to the output of the low pass filter, a second input for receiving an adjustable gain factor, and an output for providing an amplified clock phase error;
- an integrator coupled to the output of the multiplier for accumulating the amplified clock phase error to provide a phase difference;
- a summation circuit for adding the phase difference to a free-running local clock and accumulating a result to generate a clock phase; and
- a sine/cosine look-up table for providing the recovered RDS bit clock signal as indexed by the clock phase.

9. The demodulation circuit of claim 7, wherein the carrier phase recovery circuit further comprises:
- a complex multiplier for multiplying the filtered quadrature signal with a phase error, the phase error being a difference in phase between the down-sampled signal and the second local oscillator signal, the complex multiplier providing a phase error information signal;
- a complex highpass filter for receiving the phase error information signal, and in response, providing a highpass filtered phase error information signal;
- a complex square circuit for receiving the highpass filtered phase error information signal, and in response, providing a squared filtered phase error information signal;
- a first lowpass filter for receiving a real part of the squared filtered phase error information signal, and an output for providing a RDS lock signal;
- a second lowpass filter for receiving an imaginary part of the squared filtered phase error information signal, and an output for providing a lowpass filtered phase error signal;
- a multiplier for multiplying the lowpass filtered phase error signal by a gain factor to generate an amplified phase error signal;
- an integrator for accumulating the amplified phase error signal to provide a phase difference; and
- a sine/cosine table for receiving the phase difference to generate the phase error.

10. The demodulation circuit of claim 7, further comprising a signal power estimator having an input for receiving the down-sampled signal, and for providing a signal strength of the down-sampled signal.

11. A method for demodulating a radio signal, the method comprising:

receiving the radio signal;

digitizing the radio signal to produce a digital data signal at a first sample rate;

bandpass filtering the digital data signal to provide a bandpass filtered data signal centered at a first frequency;

mixing the bandpass filtered data signal with a first local oscillator signal to provide a frequency-shifted signal, wherein a first sample rate of the digital data signal is a multiple of a frequency of the first local oscillator signal;

down sampling the frequency-shifted signal to provide a down-sampled signal having a second sample rate;

quadrature mixing the down-sampled signal with a second local oscillator signal to provide a baseband signal, wherein the second sample rate is a multiple of a difference between the frequency of the first local oscillator signal and the first frequency;

filtering the baseband signal using a matched filter to match the baseband signal to a predetermined waveform to generate a filtered quadrature signal;

recovering a carrier phase of the filtered quadrature signal to produce a phase correction signal; and correcting a phase of the filtered quadrature signal by mixing the phase correction signal with the filtered quadrature signal to produce a phase corrected signal;

recovering a bit clock signal from the phase corrected signal to produce a recovered bit clock signal;

interpolating the phase corrected signal using the recovered bit clock signal as a time index to produce a resampled phase corrected signal; and slicing the resampled phase corrected signal to produce a bit signal.

12. The method of claim 11 wherein the recovering of the bit clock signal further comprises:

multiplying an absolute value of the phase corrected signal with the recovered bit clock signal to produce an output;

lowpass filtering the output to generate a clock phase error;

multiplying the clock phase error with an adjustable gain factor to provide an amplified clock phase error;

accumulating the amplified clock phase error to provide a phase difference;

adding the phase difference to a free-running local clock and accumulating a result to generate a clock phase; and indexing a sine/cosine look-up table with the clock phase to provide the recovered bit clock signal.

13. The method of claim 11 wherein the interpolating of the phase corrected signal further comprises:

determining a time when the recovered bit clock signal has a zero value while transitioning from a positive value to a negative value.

* * * * *

UNITED STATES PATENT AND TRADEMARK OFFICE
CERTIFICATE OF CORRECTION

| | | |
|---|---|---|
| PATENT NO. | : 6,868,129 B2 | Page 1 of 1 |
| APPLICATION NO. | : 09/803750 | |
| DATED | : March 12, 2001 | |
| INVENTOR(S) | : Junsong Li et al. | |

It is certified that error appears in the above-identified patent and that said Letters Patent is hereby corrected as shown below:

Column 11, Line 36, Claim No. 7:
    Change "race" to --rate--.

Signed and Sealed this

Nineteenth Day of June, 2007

JON W. DUDAS
*Director of the United States Patent and Trademark Office*

UNITED STATES PATENT AND TRADEMARK OFFICE
CERTIFICATE OF CORRECTION

PATENT NO.        : 6,868,129 B2
APPLICATION NO.   : 09/803750
DATED             : March 15, 2005
INVENTOR(S)       : Junsong Li et al.

It is certified that error appears in the above-identified patent and that said Letters Patent is hereby corrected as shown below:

Column 11, Line 36, Claim No. 7:
    Change "race" to --rate--.

This certificate supersedes Certificate of Correction issued June 19, 2007.

Signed and Sealed this

Seventh Day of August, 2007

JON W. DUDAS
*Director of the United States Patent and Trademark Office*